(12) United States Patent
Moriwaki

(10) Patent No.: US 8,067,771 B2
(45) Date of Patent: Nov. 29, 2011

(54) SEMICONDUCTOR DEVICE AND METHOD FOR MANUFACTURING THE SAME

(75) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 414 days.

(21) Appl. No.: 12/517,686

(22) PCT Filed: Jan. 22, 2008

(86) PCT No.: PCT/JP2008/050827
§ 371 (c)(1),
(2), (4) Date: Jun. 4, 2009

(87) PCT Pub. No.: WO2008/102595
PCT Pub. Date: Aug. 28, 2008

(65) Prior Publication Data
US 2009/0267069 A1 Oct. 29, 2009

(30) Foreign Application Priority Data
Feb. 21, 2007 (JP) .................................. 2007-040744

(51) Int. Cl.
*H01L 29/04* (2006.01)
*H01L 29/10* (2006.01)
*H01L 21/00* (2006.01)

(52) U.S. Cl. ............. 257/57; 257/66; 438/149; 438/154

(58) Field of Classification Search ..................... 257/57, 257/66; 438/149, 154
See application file for complete search history.

(56) References Cited

U.S. PATENT DOCUMENTS 6,635,521 B2 * 10/2003 Zhang et al. .................. 438/199
6,753,549 B2 * 6/2004 Korenari .......................... 257/57
6,803,601 B2 * 10/2004 Nakajima ........................ 257/59

FOREIGN PATENT DOCUMENTS

| JP | 2000-196096 A | 7/2000 |
| JP | 2002-343976 A | 11/2002 |
| JP | 2003-174036 A | 6/2003 |
| JP | 2007-27198 A | 2/2007 |

* cited by examiner

*Primary Examiner* — Mike Qi
(74) *Attorney, Agent, or Firm* — Birch, Stewart, Kolasch & Birch, LLP

(57) ABSTRACT

A semiconductor device includes a p-type TFT having a first semiconductor layer, and an n-type TFT having a second semiconductor layer. A tilted portion, which is widened toward the insulating substrate side, is formed in at least a part of an outer edge portion of the first semiconductor layer. A tilt angle of a surface of the tilted portion to a surface of an insulating substrate, which is an angle formed inside the first semiconductor layer, is smaller than an angle of a side surface of an outer edge portion of the second semiconductor layer to the surface of the insulating substrate, which is an angle formed inside the second semiconductor layer.

9 Claims, 6 Drawing Sheets

SEMICONDUCTOR DEVICE AND METHOD FOR MANUFACTURING THE SAME

TECHNICAL FIELD

The present invention relates to a semiconductor device and a manufacturing method thereof.

BACKGROUND ART

In recent years, so-called thin display devices such as a liquid crystal display device have been widely applied to various equipments including mobile equipments such as a cellular phone, television monitors, and the like. An active matrix-type liquid crystal display device will be described below as an example. The liquid crystal display device has an active matrix substrate, a counter substrate positioned so as to face the active matrix substrate, and a liquid crystal layer sealed between these substrates.

A common electrode, a color electrode, and the like are formed on the counter substrate. The active matrix substrate, on the other hand, has a plurality of pixels arranged in a matrix pattern, and a thin film transistor (hereinafter referred to as the "TFT") as a switching device is formed in each pixel. Thus, driving of each TFT is controlled to apply a driving voltage to the liquid crystal layer corresponding to each pixel, thereby providing desired display.

Incidentally, a TFT has a semiconductor layer, and a gate electrode provided on the semiconductor layer with a gate insulator interposed therebetween. The semiconductor layer includes a source region and a drain region which are formed as impurity regions by implanting p-type impurities or n-type impurities by using the gate electrode as a mask. A channel region formed between the source region and the drain region has been lightly doped with, for example, p-type impurities in order to adjust the threshold voltage.

For example, amorphous silicon, polysilicon, or the like can be used for the semiconductor layer. In the case where the semiconductor layer of the TFT is amorphous silicon, it is necessary to mount a driver IC on the active matrix substrate to drive the TFT due to relatively low carrier mobility of amorphous silicon. In the case where the semiconductor layer of the TFT is polysilicon, on the other hand, a drive circuit including that TFT can be directly fabricated on the active matrix substrate due to relatively high carrier mobility of polysilicon.

In order to reliably cover an outer edge portion of the semiconductor layer with the gate insulator, it is known to form a tilted portion on the outer edge portion, which is widened from the gate electrode in the thickness direction of the semiconductor layer.

However, the tilted portion formed in the semiconductor layer of an n-type TFT causes a problem of humped characteristics generated in a sub-threshold region of the current-voltage characteristics, as shown in FIG. 13 (see, e.g., Patent Document 1). In view of this problem, Patent Document 1 attempts to eliminate the humped characteristics by additionally doping the tilted portion of the semiconductor layer with impurities.

Patent Document 1: Japanese Published Patent Application No. 2002-343976

DISCLOSURE OF THE INVENTION

Problems to be Solved by the Invention

As shown in FIG. 14, however, this method can eliminate the humped characteristics in the n-type TFT, but the humped characteristics appear in a p-type TFT because the tilted portion of the semiconductor layer in the p-type TFT is also doped with impurities.

On the other hand, the inventor found the following fact as a result of diligent studies: when an outer edge portion of the semiconductor layer does not have a tapered shape but a vertical shape, no such humped characteristics are generated in the n-type TFT, but the humped characteristics are generated in the p-type TFT due to fixed charges accumulated in the outer edge portion of the semiconductor layer of the p-type TFT by the influence of ESD (electrostatic discharge) breakdown or the like, as shown in FIG. 15.

Accordingly, in a digital circuit of a CMOS transistor including an n-type TFT and a p-type TFT, a through current is generated by the influence of the humped characteristics even when the gate voltage is 0 [V], thereby causing a problem of increased power consumption.

The present invention was developed in view of the above problems, and it is an object of the present invention to reduce humped characteristics in current-voltage characteristics of a semiconductor device to reduce power consumption.

Means for Solving the Problems

In order to achieve the above object, according to the present invention, a tilted portion is formed in a semiconductor layer of a p-type thin film transistor, and a tilt angle of the tilted portion is made smaller than an angle of a side surface of an outer edge portion in a semiconductor layer of an n-type thin film transistor.

More specifically, a semiconductor device according to the present invention is a semiconductor device including: an insulating substrate; a p-type thin film transistor formed on the insulating substrate and having a first semiconductor layer; and an n-type thin film transistor formed on the insulating substrate and having a second semiconductor layer. A tilted portion, which is widened toward the insulating substrate side, is formed in at least a part of an outer edge portion of the first semiconductor layer. A tilt angle of a surface of the tilted portion to a surface of the insulating substrate, which is an angle formed inside the first semiconductor layer, is smaller than an angle of a side surface of an outer edge portion of the second semiconductor layer to the surface of the insulating substrate, which is an angle formed inside the second semiconductor layer.

Preferably, the angle of the side surface of the outer edge portion of the second semiconductor layer is a right angle.

It is desirable that the tilted portion be formed in the outer edge portion of the first semiconductor layer which is located in a direction in which the first semiconductor layer and the second semiconductor layer are arranged.

The first semiconductor layer and the second semiconductor layer may be polysilicon layers.

Moreover, a method for manufacturing a semiconductor device according to the present invention is a method for manufacturing a semiconductor device in which a p-type thin film transistor having a first semiconductor layer and an n-type thin film transistor having a second semiconductor layer are formed on an insulating substrate. The method includes the step of forming a tilted portion in at least a part of an outer edge portion of the first semiconductor layer so that the tilted portion is widened toward the insulating substrate side. In the step of forming the tilted portion, a tilt angle of a surface of the tilted portion to a surface of the insulating substrate, which is an angle formed inside the first semiconductor layer, is made smaller than an angle of a side surface of an outer edge portion of the second semiconductor layer to the surface of the insulating substrate, which is an angle formed inside the second semiconductor layer.

Preferably, the method further includes the step of forming the second semiconductor layer so that the angle of the side surface of the outer edge portion in the second semiconductor layer becomes a right angle.

It is desirable that, in the step of forming the tilted portion, the tilted portion be formed in the outer edge portion of the first semiconductor layer which is located in a direction in which the first semiconductor layer and the second semiconductor layer are arranged.

The first semiconductor layer and the second semiconductor layer may be polysilicon layers.

In the step of forming the tilted portion, the tilted portion is preferably formed by dry etching.

Next, functions of the present invention will be described below.

In the above semiconductor device, the first semiconductor layer of the p-type thin film transistor has the tilted portion which is widened toward the insulating substrate side. This prevents generation of humped characteristics in a sub-threshold region of the current-voltage characteristics of the p-type thin film transistor.

Typically, the tilted portion is formed in the outer edge portion of the first semiconductor layer which is located in the direction in which the first semiconductor layer and the second semiconductor layer are arranged. Moreover, the first semiconductor layer and the second semiconductor layer are formed by polysilicon layers. This increases the carrier mobility in the semiconductor device to a relatively high value.

Moreover, the tilt angle of the surface of the tilted portion to the surface of the insulating substrate is smaller than the angle of the side surface of the outer edge portion in the second semiconductor layer of the n-type thin film transistor to the surface of the insulating substrate. The tilt angle and the angle of the side surface of the outer edge portion of the second semiconductor layer are herein the angles formed inside the first semiconductor layer or the second semiconductor layer, respectively.

It is herein assumed that a similar tilted portion to that in the first semiconductor layer is formed in the second semiconductor layer. In this case, as shown in FIG. 13, impurities implanted into the tilted region of the second semiconductor layer cause humped characteristics in the current-voltage characteristics of the n-type thin film transistor. On the other hand, in the present invention, the angle of the side surface of the outer edge portion in the second semiconductor layer is larger than the tilt angle of the tilted portion in the first semiconductor layer, and thus, the humped characteristics are less likely to be generated in the n-type thin film transistor. In view of this, it is desirable that the angle of the side surface of the outer edge portion of the second semiconductor layer be substantially a right angle.

That is, it is not necessary to additionally implant impurities to the tilted portion of the first semiconductor layer in the p-type thin film transistor in order to cancel the humped characteristics of the n-type thin film transistor as in the conventional method. Thus, generation of the humped characteristics resulting from additional impurity implantation can be avoided in the p-type thin film transistor.

As a result, the humped characteristics can be reduced in the sub-threshold region of the current-voltage characteristics in the semiconductor device having the p-type thin film transistor and the n-type thin film transistor, whereby reduced power consumption can be achieved.

In manufacturing of the semiconductor device, the step of forming the tilted portion is performed when the first semiconductor layer is formed over the insulating substrate. In the step of forming the tilted portion, the tilted portion, which is widened toward the insulating substrate side, is formed in at least a part of the outer edge portion of the first semiconductor layer. The tilted portion can be formed by, for example, dry etching. Typically, the tilted portion is preferably formed in the outer edge portion of the first semiconductor layer which is located in the direction in which the first semiconductor layer and the second semiconductor layer are arranged. Moreover, it is desirable that the step of forming the second semiconductor layer be performed so that the angle of the side surface of the outer edge portion in the second semiconductor layer becomes a right angle.

Effects of the Invention

According to the present invention, a tilted portion is formed in a first semiconductor layer of a p-type thin film transistor, and a tilt angle of the tilted portion is made smaller than an angle of a side surface of an outer edge portion in a second semiconductor layer of an n-type thin film transistor. Thus, generation of humped characteristics in a sub-threshold region of current-voltage characteristics can be prevented in both the p-type thin film transistor and the n-type thin film transistor. As a result, humped characteristics of the semiconductor device including the p-type thin film transistor and the n-type thin film transistor can be reduced, whereby reduced power consumption can be achieved.

DESCRIPTION OF THE REFERENCE NUMERALS

Figure 1:
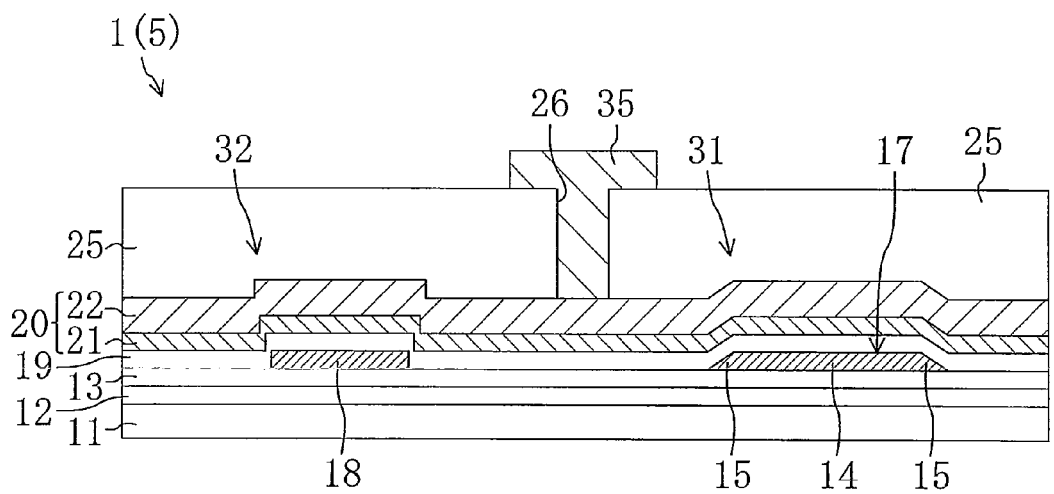
FIG. 1 is a cross-sectional view showing a main part of a semiconductor device of a first embodiment.

S liquid crystal display device
W channel length direction
1 semiconductor device
5 drive circuit
7 a-Si layer
8 polysilicon layer
10 active matrix substrate
11 glass substrate
14 flat portion
15 tilted portion
17 first semiconductor layer
18 second semiconductor layer
20 gate electrode
21 first electrode layer
22 second electrode layer
25 interlayer insulating film
31 p-type TFT
32 n-type TFT
33 source region
34 drain region
35 gate line
36 source line
37 drain line
41-44 resist film
50 counter substrate
51 liquid crystal layer

BEST MODE FOR CARRYING OUT THE INVENTION

Hereinafter, embodiments of the present invention will be described in detail based on the accompanying drawings. Note that the present invention is not limited to the embodiments described below.

First Embodiment

FIGS. 1 through 12 show a first embodiment of the present invention.

Figure 7:
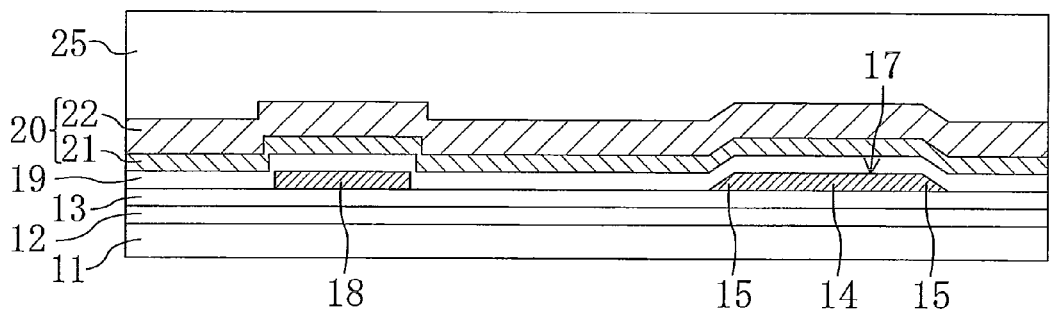
FIG. 7 is a cross-sectional view showing an interlayer insulating film.
Figure 8:
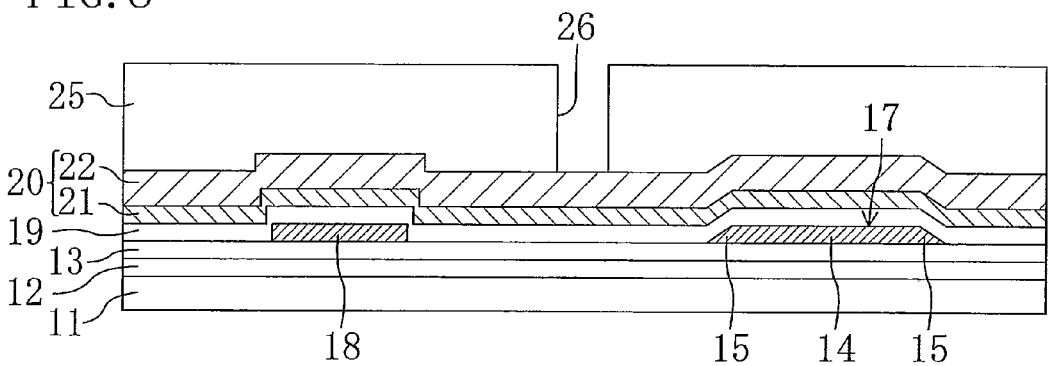
FIG. 8 is a cross-sectional view showing a contact hole formed in the interlayer insulating film.
Figure 9:
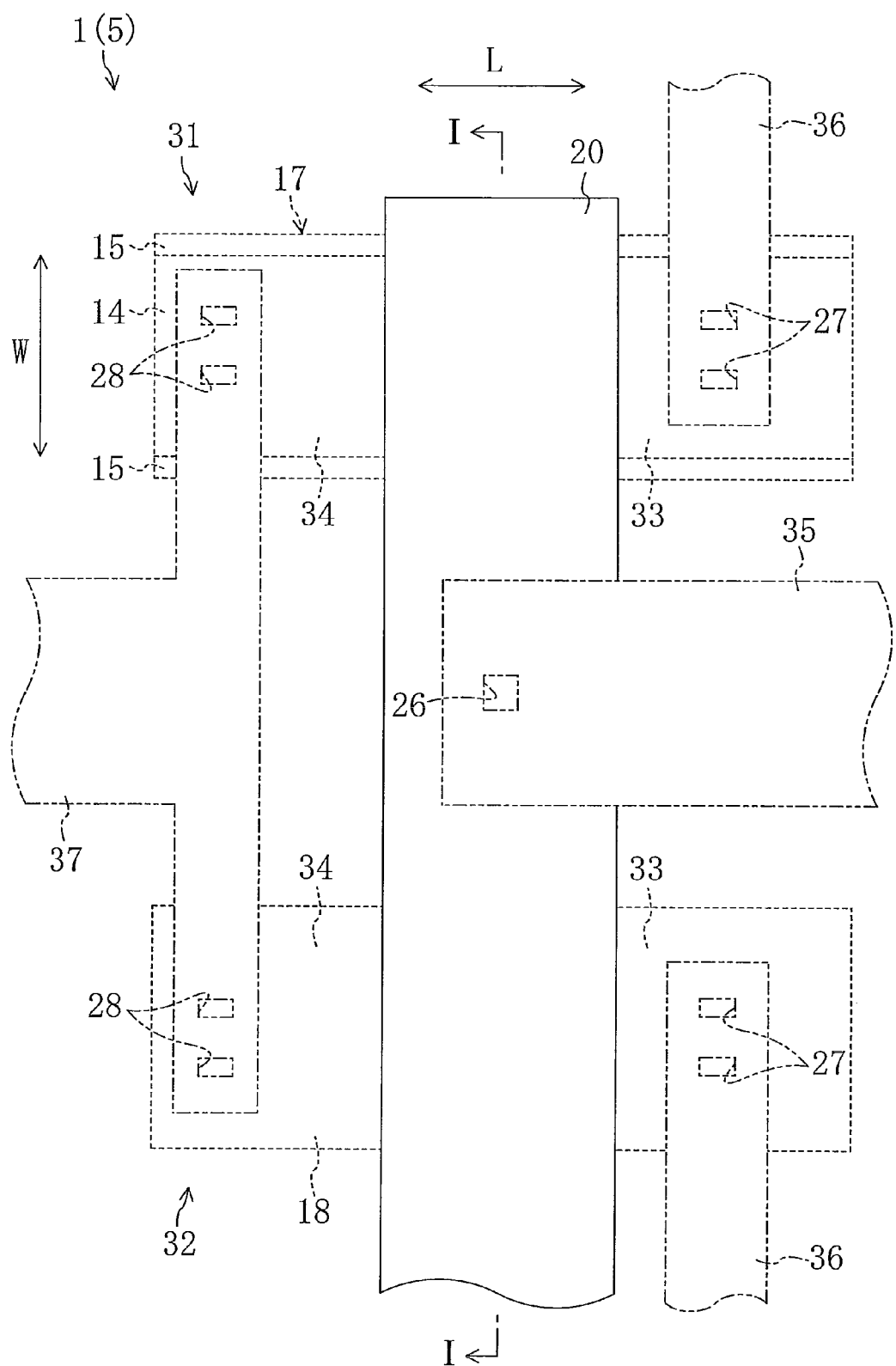
FIG. 9 is a plan view showing a main part of a semiconductor device.
Figure 10:
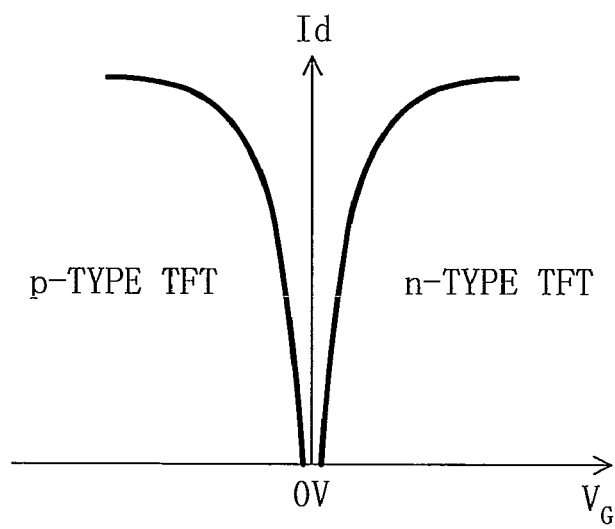
FIG. 10 is a graph showing current-voltage characteristics of the semiconductor device.
Figure 11:
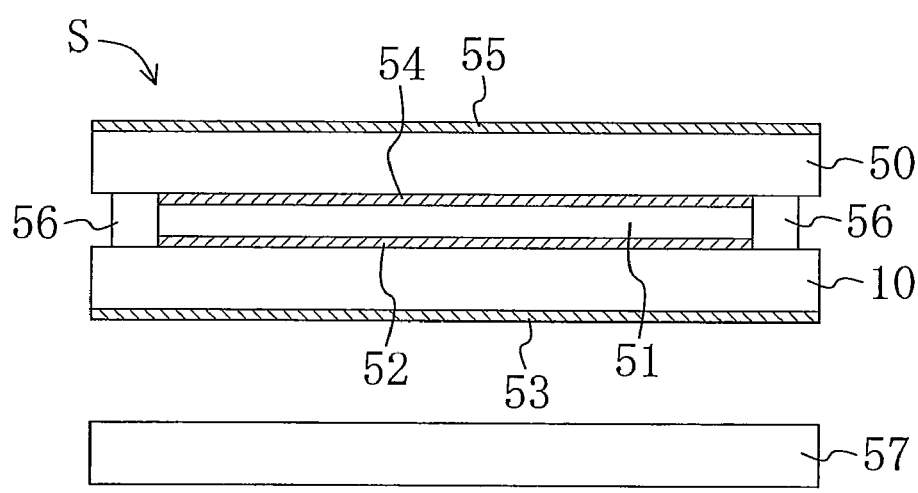
FIG. 11 is a cross-sectional view showing a schematic structure of a liquid crystal display device.
Figure 12:
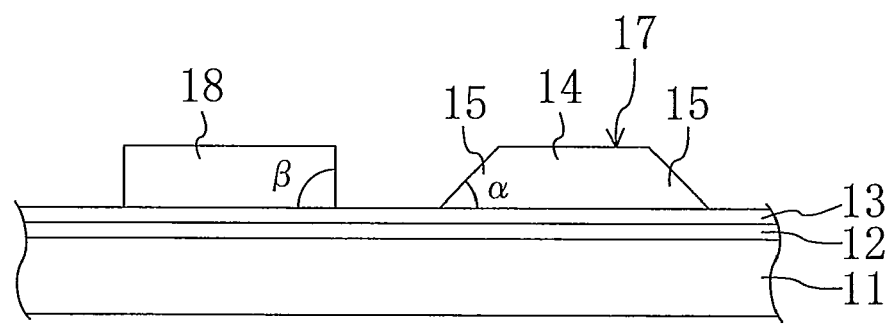
FIG. 12 is a cross-sectional view schematically showing a first semiconductor layer and a second semiconductor layer.

FIG. 9 is a plan view showing a main part of a semiconductor device 1 of the first embodiment. FIG. 1 is a cross-sectional view taken along line I-I in FIG. 9. FIGS. 2 through 8 are cross-sectional views showing each manufacturing step of the semiconductor device 1. FIG. 10 is a graph showing current-voltage characteristics of the semiconductor device 1. FIG. 11 is a cross-sectional view showing a schematic structure of a liquid crystal display device S. FIG. 12 is a cross-sectional view schematically showing a first semiconductor layer 17 and a second semiconductor layer 18 which will be described later.

The semiconductor device 1 of the present embodiment forms, for example, an active matrix substrate 10 of the liquid crystal display device S. First, a schematic structure of the liquid crystal display device S will be described below.

As shown in FIG. 11, the liquid crystal display device S includes the active matrix substrate 10 as a first substrate, a counter substrate 50 as a second substrate provided so as to face the active matrix substrate 10, and a liquid crystal layer 51 formed between the active matrix substrate 10 and the counter substrate 50. The liquid crystal layer 51 is sealed between the substrates 10, 50 by a seal member 56. Moreover, a backlight unit 57 serving as a light source is positioned on the opposite side of the active matrix substrate 10 to the liquid crystal layer 51.

A common electrode, a color filter, and the like, which are not shown in the figure, are formed on the counter substrate 50. An alignment film 54 is provided on the surface on the liquid crystal layer 51 side of the counter substrate 50, and a polarizing plate 55 is positioned on the opposite surface of the counter substrate 50 to the liquid crystal layer 51.

An alignment film 52 is provided on the surface on the liquid crystal layer 51 side of the active matrix substrate 10, and a polarizing plate 53 is positioned on the opposite surface of the active matrix substrate 10 to the liquid crystal layer 51. Although not shown in the figure, the active matrix substrate 10 has a display region substantially in the middle of the substrate, which contributes to display. A plurality of pixels, which are arranged in a matrix pattern, are formed in the display region. A frame region, which does not contribute to display, is formed outside the display region.

As shown in FIG. 1, the active matrix substrate 10 has a rectangular glass substrate 11 as an insulating substrate. Although not shown in the figure, a thin film transistor (hereinafter referred to as the "TFT") as a switching device is formed in every pixel on the glass substrate 11 in the display region. Each TFT is connected to a pixel electrode (not shown) provided in every pixel, and is connected to a source line and a gate line which are not shown in the figure.

A drive circuit 5 for controlling driving of the TFT of each pixel is directly fabricated on the glass substrate 11 in the frame region. The drive circuit 5 is formed by CMOS including a source driver and a gate driver. The source lines and the gate lines are extended to the frame region and connected to the drive circuit 5.

Thus, the drive circuit 5 switches the TFTs on a pixel-by-pixel basis to control driving of the liquid crystal layer 51 so that light from the backlight unit 57 is selectively transmitted through the liquid crystal layer 51, thereby providing desired display.

The active matrix substrate 10 having the drive circuit 5 will be described in detail below.

As shown in FIGS. 1 and 9, the drive circuit 5 of the active matrix substrate 10 includes the glass substrate 11, a p-type TFT 31 formed on the glass substrate 11 and having a first semiconductor layer 17, and an n-type TFT 32 formed on the glass substrate 11 and having a second semiconductor layer 18.

The p-type TFT 31 and the n-type TFT 32 have a top gate-type structure in which a gate electrode 20 is positioned on the opposite side of the first semiconductor layer 17 or the second semiconductor layer 18 to the glass substrate 11, respectively.

As shown in FIG. 1, a first undercoat layer 12 made of, for example, a SiNO film is formed on the surface of the glass substrate 11. Moreover, a second undercoat layer 13 made of, for example, a TEOS film, is formed on the surface of the first undercoat layer 12.

As shown in FIGS. 1 and 9, the first semiconductor layer 17 and the second semiconductor layer 18 are formed in, for example, a rectangular island shape on the surface of the second undercoat layer 13. The first semiconductor layer 17 and the second semiconductor layer 18 are positioned next to each other at a predetermined interval, and are made of a polysilicon layer. Note that, although only one first semiconductor layer 17 and one second semiconductor layer 18 are shown in FIGS. 1 and 9, the present invention is not limited to this, and a plurality of first semiconductor layers 17 and a plurality of second semiconductor layers 18 may be formed.

As shown in FIG. 1, a tilted portion 15, which is widened toward the glass substrate 11 side, is formed in at least a part of an outer edge portion of the first semiconductor layer 17.

As shown in FIG. 1, the tilted portion 15 is formed in the outer edge portion of the first semiconductor layer 17 which is located in a direction W in which the first semiconductor layer 17 and the second semiconductor layer 18 are arranged (a channel width direction). In other words, the tilted portion 15 is formed on both sides of the flat portion 14 in the direction W in the outer edge portion of the first semiconductor layer 17.

As shown in FIG. 12, a tilt angle α of the surface of the tilted portion 15 to the surface of the glass substrate 11, which is an angle formed inside the first semiconductor layer 17, is smaller than an angle β of the side surface of an outer edge portion of the second semiconductor layer 18 to the surface of the glass substrate 11, which is an angle formed inside the second semiconductor layer 18. In other words, the angle β of the side surface of the outer edge portion in the second semiconductor layer 18 is larger than the tilt angle α of the tilted portion 15 in the first semiconductor layer 17. It is desirable that the angle β be substantially a right angle.

As shown in FIG. 1, a gate insulator 19 is formed on the second undercoat layer 13 so as to cover the first semiconductor layer 17 and the second semiconductor layer 18. Moreover, the gate electrode 20 is formed on the gate insulator 19. As shown in FIG. 1, the gate electrode 20 is formed by a first electrode layer 21 formed on the surface of the gate insulator 19 and made of, for example, TaN, and a second electrode layer 22 formed on the surface of the first electrode layer 21 and made of, for example, W.

As shown in FIG. 9, the gate electrode 20 is formed so as to extend in the channel width direction W, and is positioned so as to cross the first semiconductor layer 17 and the second semiconductor layer 18 when viewed from a normal direction to the surface of the glass substrate 11. In the first semiconductor layer 17 and the second semiconductor layer 18, a region which overlaps the gate electrode 20 serve as a channel region. On the other hand, a source region 33 and a drain region 34 are formed in a region which does not overlap the gate electrode 20 in the first semiconductor layer 17 and the second semiconductor layer 18.

As shown in FIG. 1, an interlayer insulating film 25 is formed on the surface of the second electrode layer 22 of the gate electrode 20. A plurality of contact holes are formed in the interlayer insulating film 25. That is, as shown in FIGS. 1 and 9, a first contact hole 26 is formed above the gate electrode 20 between the first semiconductor layer 17 and the second semiconductor layer 18 in the interlayer insulating film 25. Thus, a gate line 35 electrically connected to the gate electrode 20 through the first contact hole 26 is formed in the interlayer insulating film 25.

Moreover, second contact holes 27 are formed above each source region 33 of the first semiconductor layer 17 and the second semiconductor layer 18 in the interlayer insulating film 25. Thus, source lines 36 respectively electrically connected to the source regions 33 through the second contact holes 27 are formed in the interlayer insulating film 25.

Moreover, third contact holes 28 are formed above each drain region 34 of the first semiconductor layer 17 and the second semiconductor layer 18 in the interlayer insulating film 25. Thus, a drain line 37 electrically connected to the drain regions 34 through the third contact holes 28 is formed in the interlayer insulating film 25. As shown in FIG. 9, the drain line 37 is formed as a common line of the first semiconductor layer 17 and the second semiconductor layer 18.

[Manufacturing Method]

Next, a manufacturing method of the active matrix substrate 10 and the drive circuit 5 will be described below.

(Step of Forming the Semiconductor Layers)

Figure 2:
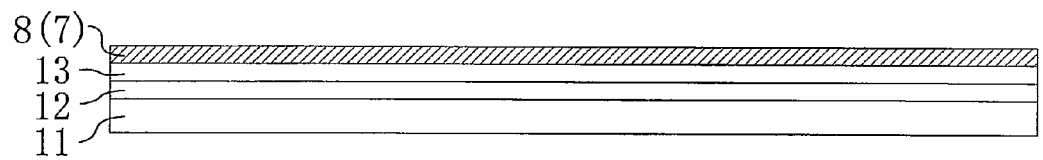
FIG. 2 is a cross-sectional view showing silicon layers formed over a glass substrate.

First, the step of forming a polysilicon layer 8 is performed. As shown in FIG. 2, the first undercoat layer 12 made of a SiNO film, the second undercoat layer 13 made of a TEOS film, and an a-Si layer (amorphous silicon layer) 7 are formed on the glass substrate 11 in this order by a plasma enhanced chemical vapor deposition (PECVD) method or the like.

Although the thickness of each undercoat layer 12, 13 is not specifically limited, it is preferable to form the first undercoat layer 12 with a thickness of, for example, about 30 to 70 nm, and to form the second undercoat layer 13 with a thickness of, for example, about 50 to 150 nm. Although the thickness of the a-Si layer 7 is not specifically limited, the a-Si layer 7 may be formed with a thickness of, for example, about 30 to 70 nm.

A mixed gas of monosilane ($SiH_4$), a nitrous oxide gas ($N_2O$), and ammonia ($NH_3$), or the like can be used as a source gas for forming the SiNO film of the first undercoat layer 12. On the other hand, a silicon oxide ($SiO_2$) film may be formed by using a tetra-ethyl-ortho-silicate (TEOS) gas as a source gas for forming the TEOS film of the second undercoat film 13. For example, monosilane ($SiH_4$), disilane ($Si_2H_6$), or the like can be used as a source gas for forming the a-Si layer 7.

Note that the undercoat layers 12, 13 may alternatively be formed by a silicon nitride (SiNx (where x is any number)) film or the like using a mixed gas of monosilane ($SiH_4$) and ammonia ($NH_3$), or the like as a source gas.

Next, in order to polycrystallize the a-Si layer 7, solid phase crystallization (SPC) is performed by heat treatment at about 600° C. Before the SPC is performed, a metal catalyst such as nickel (Ni) may be applied to the a-Si layer 7 as a pretreatment for forming continuous grain silicon (CG silicon).

Incidentally, performing only the SPC tends to reduce the silicon grain size to a relatively small value, or even if the grain size is large, tends to result in many crystal defects contained in the crystal grains. This causes undesirable characteristics such as reduced carrier mobility in polysilicon. Thus, it is preferable to improve the quality of polysilicon crystal grains by performing a laser annealing method using excimer laser light after the SPC. Solid-state laser light or the like may alternatively be used. The polysilicon layer 8 is formed in this manner.

Then, the polysilicon layer 8 is patterned to form the first semiconductor layer 17 and the second semiconductor layer 18. In other words, the first semiconductor layer 17 and the second semiconductor layer 18 are formed by the polysilicon layer 8.

(Step of Forming the First Semiconductor Layer)

The step of forming the tilted portion is performed in the step of forming the first semiconductor layer 17 of the p-type TFT 31. In the step of forming the tilted portion, the tilted portion 15, which is widened toward the glass substrate 11 side, is formed in at least a part of the outer edge portion of the first semiconductor layer 17.

Figure 3:
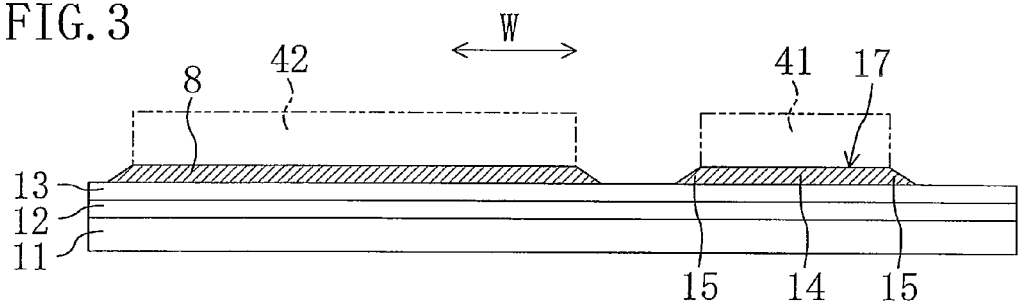
FIG. 3 is a cross-sectional view showing a patterned first semiconductor layer.

First, as shown in FIG. 3, resist films 41, 42 are formed by a photolithography method. The resist film 41 is positioned in a region where the flat portion 14 of the first semiconductor layer 17 is to be formed. The resist film 42, on the other hand, is positioned in a relatively large region including a region where the second semiconductor layer 18 is to be formed.

Then, as shown in FIG. 3, the polysilicon layer 8 exposed from the resist films 41, 42 are dry-etched to form the islandshaped first semiconductor layer 17, and to form the tilted portion 15 in the first semiconductor layer 17. A mixed gas of $CF_4$ and $O_2$ is used as an etching gas, and the tilted portion 15 having a desired tilt angle α is formed by appropriately adjusting the gas flow ratio.

Note that the region of the first semiconductor layer 17, which was covered by the resist film 41 and was not etched, becomes the flat portion 14. Moreover, as shown in FIG. 3, an end of the polysilicon layer 8 which is exposed around the resist film 42 is also formed in a tilted shape.

At this time, as shown in FIG. 9, the tilted portion 15 is formed in the outer edge portion of the first semiconductor layer 17 which is located in the direction W in which the first semiconductor layer 17 and the second semiconductor layer 18 are arranged.

Thus, the tilt angle α of the surface of the tilted portion 15 to the surface of the glass substrate 11, which is an angle formed inside the first semiconductor layer 17, is made smaller than the angle β of the side surface of the outer edge portion of the second semiconductor layer 18 to the surface of the glass substrate 11, which is an angle formed inside the second semiconductor layer 18 described below.

(Step of Forming the Second Semiconductor Layer)

Next, the step of forming the second semiconductor layer of the n-type TFT 32 is performed. In this step, the polysilicon layer 8, which was covered by the resist film 42 and was not etched in the above step of forming the tilted portion, is further etched to form the second semiconductor layer 18.

Figure 4:
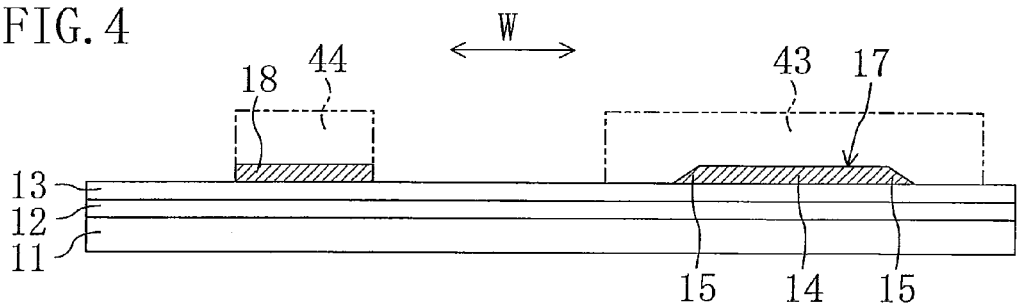
FIG. 4 is a cross-sectional view showing a patterned second semiconductor layer.

More specifically, after the resist films 41, 42 are removed, a resist film 43 is formed so as to cover the first semiconductor layer 17, and a relatively small resist film 44 is formed on the surface of the polysilicon layer 8 on which the resist film 42 used to be formed, as shown in FIG. 4. Then, the polysilicon layer 8 exposed from the resist film 44 is etched away to form the second semiconductor layer 18. At this time, no tilted portion is formed in the outer edge portion of the second semiconductor layer 18 so that the angle β of the side surface of the outer edge portion of the second semiconductor layer 18 to the surface of the glass substrate 11 becomes larger than the tilt angle α. It is especially desirable that the angle β be substantially a right angle.

At this time, the first semiconductor layer 17 is not etched because it is protected by the resist film 43. Then, the resist films 43, 44 are removed to form the first semiconductor layer 17 and the second semiconductor layer 18.

(Step of Forming the Gate Insulator)

Figure 5:
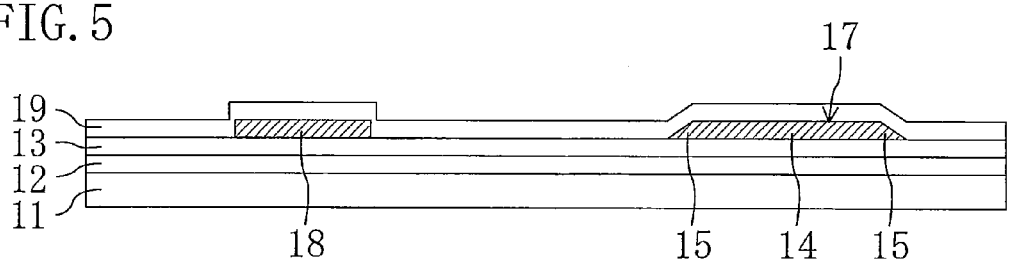
FIG. 5 is a cross-sectional view showing a gate insulator.

Next, the step of forming the gate insulator 19 is performed. More specifically, as shown in FIG. 5, the gate insulator (GI) 19 is formed over the second undercoat layer 13 by using a TEOS gas as a source gas so as to cover the first semiconductor layer 17 and the second semiconductor layer 18. Although the thickness of the gate insulator 19 is not specifically limited, it is preferable to form the gate insulator 19 with a thickness of, for example, about 30 to 150 nm. Moreover, the material of the gate insulator 19 is not specifically limited, and a SiNx film, a SiON film, or the like may be used alternatively. The gate insulator 19 may be a lamination of the plurality of materials described above. For example, similar materials to those described with respect to formation of the undercoat layers 12, 13 may be used as a source gas for forming the SiNx film and the SiON film.

(Channel Doping Step)

Next, in order to control the threshold value of the p-type TFT 31 and the n-type TFT 32, the whole surface of the first semiconductor layer 17 and the second semiconductor layer is doped with boron impurities by an ion doping method or the like to from a doped layer. Although the boron doping concentration in the doped layer is not specifically limited, it may be, for example, $1\times10^{12}$ to $1\times10^{14}$ ions/cm$^2$. Note that the above doping is not necessarily performed if the threshold control of the p-type TFT 31 is not necessary.

Then, although not shown in the figure, a resist film is first patterned only on the formation region of the p-type TFT 31 by a photolithography method in order to control the threshold value of the n-type TFT 32. Then, channel doping is performed by adding a predetermined amount of boron only to the formation region of the n-type TFT 32 by an ion doping method or the like, thereby forming a doped layer of the n-type TFT 32. Although the boron doping concentration in the doped layer of the n-type TFT 32 is not specifically limited, it may be, for example, $1\times10^{12}$ to $1\times10^{14}$ ions/cm$^2$.

At this time, if a gate overlap structure (GOLD structure) is required as a measure against hot carrier degradation, a resist film may be patterned into a desired shape by a photolithography method and a predetermined amount of phosphorus may be implanted. Note that the channel doping may be performed before etching the gate insulator 19.

(Step of Forming the Gate Electrode)

Figure 6:
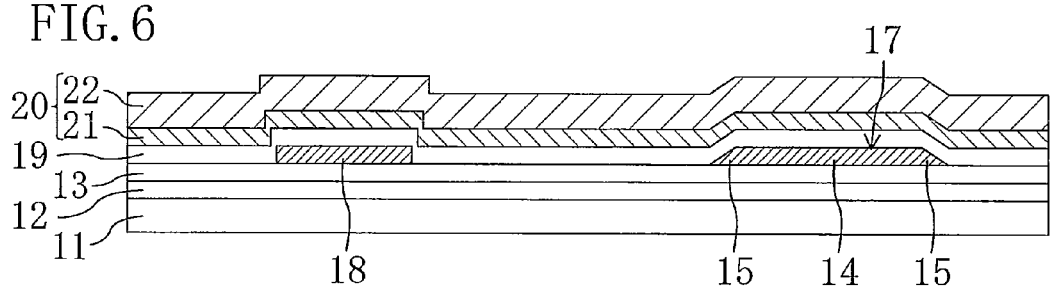
FIG. 6 is a cross-sectional view showing a gate electrode formed by a first electrode layer and a second electrode layer.

Next, the step of forming the gate electrode (GE) is performed. More specifically, as shown in FIG. 6, the first electrode layer 21 made of a tantalum nitride (TaN) film is first formed on the surface of the gate insulator 19 by sputtering or the like, and the second electrode layer 22 made of a tungsten (W) film is then formed on the surface of the first electrode layer 21. Although the respective thicknesses of the W film and the TaN film are not specifically limited, the W film may be formed with a thickness of, for example, about 300 to 400 nm, and the TaN film may be formed with a thickness of, for example, about 40 to 60 nm.

Then, a resist film is patterned into a desired shape on the surface of the second electrode layer 22 by a photolithography method. Thereafter, dry etching is performed by using a mixed gas produced by adjusting the partial pressure of components, such as argon (Ar), sulfur hexafluoride ($SF_6$), carbon tetrafluoride ($CF_4$), oxygen ($O_2$), chlorine ($Cl_2$), and the like, as an etching gas, thereby forming the gate electrode 20 having a two-layer structure and having a rectangular planar shape.

Examples of metal materials used for the gate electrode 20 include low-resistance metals such as tantalum (Ta), molybdenum (Mo), molybdenum tungsten (MoW), and aluminum (Al), and refractory metals having a flat surface and being stable in characteristics. The gate electrode 20 may be a lamination formed by any of the plurality of materials shown above.

(Step of Forming the Source/Drain Regions)

Next, although not shown in the figure, a resist film is patterned into a desired shape by a photolithography method, and then, phosphorus ions are implanted at a high concentration for the n-type TFT 32, and boron ions are implanted at a high concentration for the p-type TFT 31 by an ion doping method or the like in order to form diffusion regions of the p-type TFT 31 and the n-type TFT 32. Although the doping concentration of phosphorus and boron is not specifically limited, it may be, for example, $1\times10^{15}$ to $1\times10^{17}$ ions/cm$^2$. At this time, if necessary, a resist film may further be patterned into a desired shape by a photolithography method to form an LDD (Lightly Doped Drain) structure.

In the case where the semiconductor layers 17, 18 are formed by CG silicon, doping with a gettering material such as phosphorus may be simultaneously performed in order to eliminate undesirable influences of the residual metal catalyst. Then, a thermal activation process is performed at about 700° C. for six hours in order to activate impurity ions existing in the semiconductor layers 17, 18. This improves the electric conduction property of the diffusion regions. Note that, although the electric conduction property of the diffusion regions is not specifically limited, 1 kΩ/☐ or less at 25° C. is preferable in terms of the resistivity.

Another example of the activation method includes a method of applying excimer laser light, or the like. As a result, outer diffusion regions (the source region 33 and the drain region 34), which are formed by a channel region and an n+ region, are formed in the n-type TFT 32, while outer diffusion regions (the source region 33 and the drain region 34), which are formed by a channel region and a p+ region, are formed in the p-type TFT 31.

(Step of Forming the Interlayer Insulating Film)

Next, the step of forming the interlayer insulating film 25 covering the gate electrode 20 is performed. More specifically, as shown in FIGS. 7 and 9, the interlayer insulating film 25 having a thickness of about 800 to 1,200 nm is formed over the surface of the gate insulator 19 by a PECVD method so as to cover the gate electrode 20. For example, a SiNx film, a SiON film, a TEOS film, or the like may be used as a material of the interlayer insulating film 25. The interlayer insulating film 25 may be a lamination formed by any of the plurality of materials shown above.

(Step of Forming the Contact Holes)

Next, as shown in FIGS. 8 and 9, the contact holes 26, 27, 28 are formed in the interlayer insulating film 25. More specifically, after a resist film is patterned into a desired shape by a photolithography method, the interlayer insulating film 25 and the gate insulator 19 are wet-etched with a hydrofluoric acid-based etchant. Thus, the first contact hole 26 is formed above the gate electrode 20 in the interlayer insulating film 25, and the second and third contact holes 27, 28 are formed above the source region 33 and the drain region 34 in the interlayer insulating film 25 and the gate insulator 19.

(Annealing Step)

Next, a hydrogenation annealing process is performed at about 400° C. in order to further improve the quality of the first semiconductor layer 17 and the second semiconductor layer 18.

(Step of Forming the Lines)

Next, the step of forming the gate line 35, the source lines 36, and the drain line 37 is performed as shown in FIGS. 1 and 9. More specifically, a titanium (Ti) film is first formed with a thickness of about 100 to 200 nm by a sputtering method or the like, and an aluminum-silicon (Al—Si)-based alloy film is then formed with a thickness of about 500 to 1,000 nm. Thereafter, a Ti film is further formed with a thickness of about 100 to 200 nm.

Then, a resist film is patterned into a desired shape by a photolithography method, and the above metal thin films are then patterned by dry etching, thereby respectively forming the gate line 35 connected to the gate electrode 20 through the first contact hole 26, the source lines 36 respectively connected to the source regions 33 through the second contact holes 27, and the drain line 37 connected to the drain region 34 through the third contact holes 28.

The drive circuit 5 including the p-type TFT 31 and the n-type TFT 32 is formed on the glass substrate 11 by the steps described above.

A manufacturing method of the liquid crystal display device S includes an active matrix substrate formation step, a counter substrate formation step, and a bonding step. The active matrix substrate 10 and the counter substrate 50 are formed separately.

In the active matrix substrate formation step, pixel electrodes, TFTs for driving the respective pixel electrodes, and the like, for example, are formed on the glass substrate 11, and the drive circuit 5 is formed in the manner described above to manufacture the active matrix substrate 10. In the counter substrate formation step, a common electrode, a color filter, and the like are formed by a common manufacturing method to manufacture the counter substrate 50. Then, in the bonding step, the active matrix substrate 10 and the counter substrate 50 are bonded together, and the liquid crystal layer 51 is sealed between the substrates 10, 50 by the seal member 56. The backlight unit 57 is formed by a common manufacturing method. Then, the backlight unit 57 is positioned on the opposite side of the active matrix substrate 10 to the liquid crystal layer 51, thereby manufacturing a liquid crystal display device.

[Effects of the First Embodiment]

Accordingly, in the first embodiment, the tilted portion 15 is formed in the first semiconductor layer 17 of the p-type TFT 31, and the tilt angle α of the tilted portion 15 is made smaller than the angle β of the side surface of the outer edge portion in the second semiconductor layer 18 of the n-type TFT 32. Thus, as shown in FIG. 10, generation of humped characteristics in the sub-threshold region of the current-voltage characteristics can be prevented both in the p-type TFT 31 and the n-type TFT 32. As a result, the humped characteristics in the current-voltage characteristics are reduced in the drive circuit 5 of the semiconductor device 1 including the p-type TFT 31 and the n-type TFT 32, whereby power consumption can be reduced.

That is, since the first semiconductor layer 17 of the p-type TFT 31 has the tilted portion 15 which is widened toward the glass substrate 11 side, generation of the humped characteristics can be prevented in the sub-threshold region of the current-voltage characteristics of the p-type TFT 31, as shown by the left graph in FIG. 10.

Figure 13:
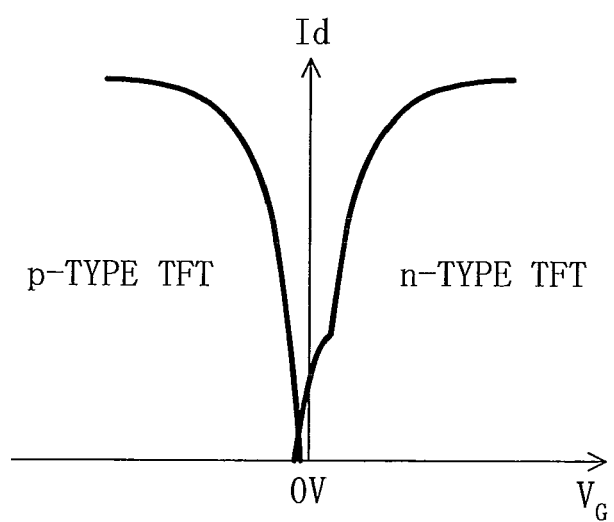
FIG. 13 is a graph showing current-voltage characteristics of a conventional semiconductor device.
Figure 14:
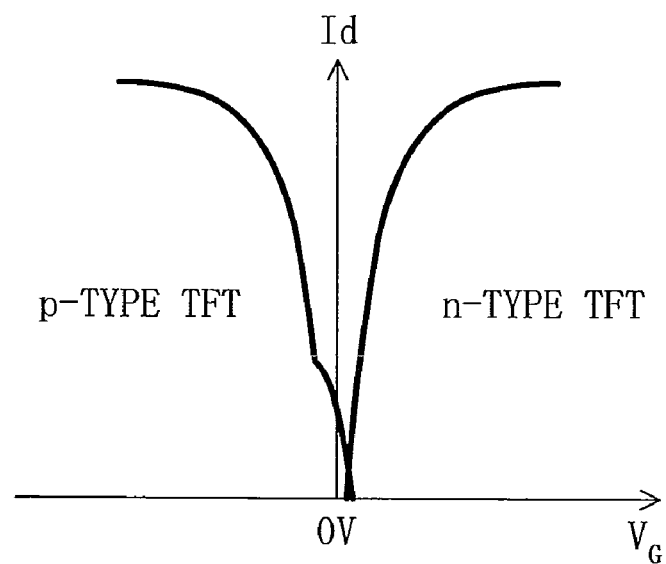
FIG. 14 is a graph showing current-voltage characteristics of a conventional semiconductor device.
Figure 15:
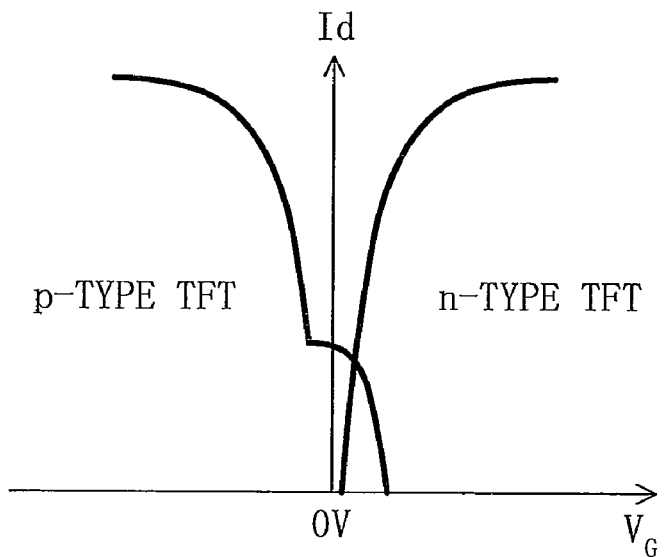
FIG. 15 is a graph showing current-voltage characteristics of a conventional semiconductor device.

It is herein assumed that a similar tilted portion to that in the first semiconductor layer 17 is formed in the second semiconductor layer 18. In this case, as shown in FIG. 13, impurities implanted into the tilted region of the second semiconductor layer 18 generate humped characteristics in the current-voltage characteristics of the n-type TFT 32. In the present embodiment, however, the tilt angle α of the surface of the tilted portion 15 in the p-type TFT 31 is made smaller than the angle β of the side surface of the outer edge portion in the second semiconductor layer 18 of the n-type TFT 32 to the surface of the glass substrate 11 (i.e., the angle β is made larger than the tilted angle α). This enables the humped characteristics to be less likely to be generated in the n-type TFT 32. Especially, setting the angle β to substantially a right angle prevents generation of the humped characteristics in the current-voltage characteristics of the n-type TFT 32.

As a result, the problem of the humped characteristics, which had a trade-off relation between the p-type TFT 31 and the n-type TFT 32, is solved, whereby the humped characteristics can be reduced in the sub-threshold region of the current-voltage characteristics in the drive circuit 5 of the semiconductor device 1 having the p-type TFT 31 and the n-type TFT 32, and power consumption can be reduced.

Moreover, forming the first semiconductor layer 17 and the second semiconductor layer 18 by polysilicon layers increases the carrier mobility in the semiconductor device 1 to a relatively high value, thereby enabling the drive circuit 5 to be directly fabricated on the glass substrate 11 of the active matrix substrate 10.

Other Embodiments

In the first embodiment, the active matrix substrate 10, which forms the liquid crystal display device S and has the drive circuit 5 formed thereon, is described as an example of the semiconductor device 1. However, the present invention is not limited to this. For example, the present invention is similarly applicable to, for example, active matrix substrates of other display devices such as an organic EL display device. The present invention is similarly applicable to any semiconductor device having a p-type TFT and an n-type TFT.

INDUSTRIAL APPLICABILITY

As described above, the present invention is useful for a semiconductor device and a manufacturing method thereof. The present invention is especially suitable for reducing humped characteristics in the current-voltage characteristics of the semiconductor device, and thus reducing power consumption.

The invention claimed is:

1. A semiconductor device, comprising:
   an insulating substrate;
   a p-type thin film transistor formed on the insulating substrate and having a first semiconductor layer; and
   an n-type thin film transistor formed on the insulating substrate and having a second semiconductor layer, wherein
   a tilted portion, which is widened toward the insulating substrate side, is formed in at least a part of an outer edge portion of the first semiconductor layer and
   a tilt angle of a surface of the tilted portion to a surface of the insulating substrate, which is an angle formed inside the first semiconductor layer, is smaller than an angle of a side surface of an outer edge portion of the second semiconductor layer to the surface of the insulating substrate, which is an angle formed inside the second semiconductor layer.

2. The semiconductor device of claim 1, wherein
   the angle of the side surface of the outer edge portion of the second semiconductor layer is a right angle.

3. The semiconductor device of claim 1, wherein
   the tilted portion is formed in the outer edge portion of the first semiconductor layer which is located in a direction in which the first semiconductor layer and the second semiconductor layer are arranged.

4. The semiconductor device of claim 1, wherein
   the first semiconductor layer and the second semiconductor layer are polysilicon layers.

5. A method for manufacturing a semiconductor device in which a p-type thin film transistor having a first semiconductor layer and an n-type thin film transistor having a second semiconductor layer are formed on an insulating substrate, comprising the step of:
   forming a tilted portion in at least a part of an outer edge portion of the first semiconductor layer so that the tilted portion is widened toward the insulating substrate side, wherein
   in the step of forming the tilted portion, a tilt angle of a surface of the tilted portion to a surface of the insulating substrate, which is an angle formed inside the first semiconductor layer, is made smaller than an angle of a side surface of an outer edge portion of the second semiconductor layer to the surface of the insulating substrate, which is an angle formed inside the second semiconductor layer.

6. The method of claim 5, further comprising the step of:
   forming the second semiconductor layer so that the angle of the side surface of the outer edge portion in the second semiconductor layer becomes a right angle.

7. The method of claim 5, wherein
   in the step of forming the tilted portion, the tilted portion is formed in the outer edge portion of the first semiconductor layer which is located in a direction in which the first semiconductor layer and the second semiconductor layer are arranged.

8. The method of claim 5, wherein
   the first semiconductor layer and the second semiconductor layer are polysilicon layers.

9. The method of claim 5, wherein
   in the step of forming the tilted portion, the tilted portion is formed by dry etching.

* * * * *